(12) United States Patent
Fricker

(10) Patent No.: US 9,285,428 B2
(45) Date of Patent: Mar. 15, 2016

(54) METHOD OR VOLTAGE DETECTION SYSTEM FOR DETERMINING A CORRECTION PARAMETER FOR A MEASUREMENT CHANNEL AND FOR DETECTING A TERMINAL VOLTAGE OF AN ELECTRIC MOTOR

(75) Inventor: David Fricker, Oberhoffen sur Moder (FR)

(73) Assignee: Robert Bosch GmbH, Stuttgart (DE)

( * ) Notice: Subject to any disclaimer, the term of this patent is extended or adjusted under 35 U.S.C. 154(b) by 463 days.

(21) Appl. No.: 13/810,268

(22) PCT Filed: Jul. 8, 2011

(86) PCT No.: PCT/EP2011/061668
§ 371 (c)(1),
(2), (4) Date: Jan. 15, 2013

(87) PCT Pub. No.: WO2012/007393
PCT Pub. Date: Jan. 19, 2012

(65) Prior Publication Data
US 2013/0113460 A1    May 9, 2013

(30) Foreign Application Priority Data
Jul. 16, 2010    (DE) .......................... 10 2010 031 430

(51) Int. Cl.
*G01R 19/00*        (2006.01)
*G01R 31/34*        (2006.01)
(Continued)

(52) U.S. Cl.
CPC ................ *G01R 31/343* (2013.01); *G01R 1/00* (2013.01); *G01L 1/00* (2013.01); *G06Q 10/00* (2013.01)

(58) Field of Classification Search
CPC .............. G01R 1/00; G01L 1/00; G01L 7/00; G06Q 10/00; G06Q 2220/00; G06Q 2230/00
USPC ........................................................ 324/76.11
See application file for complete search history.

(56) References Cited

U.S. PATENT DOCUMENTS 4,491,772 A  *  1/1985  Bitting .................... H02P 6/142
                                                    318/400.04
5,119,071 A  *  6/1992  Takezawa ............... F04B 49/06
                                                    318/130
(Continued)

FOREIGN PATENT DOCUMENTS

CH            483640        12/1969

OTHER PUBLICATIONS

International Search Report for Application No. PCT/EP2011/061668 dated Oct. 12, 2011 (3 pages).
(Continued)

*Primary Examiner* — Huy Q Phan
*Assistant Examiner* — Temilade Rhodes-Vivour
(74) *Attorney, Agent, or Firm* — Michael Best & Friedrich LLP

(57) ABSTRACT

The invention relates to a method for determining a correction parameter for a measurement channel (6) which is connected to a connection terminal (3) of an electric motor (2) in order to measure a terminal voltage (U1, U2), characterized in that the connection terminal (3) is connected to a first potential via switching elements (T1, T2, T3, T4) for driving the electric motor (2), after a steady state of the measurement channel (6) has been reached, the connection terminal (3) is connected to a second potential, which differs from the first, by changing over at least one switching element (T1, T2, T3, T4), the dynamic response of the measurement channel (6) is detected following connection to the second potential, and the correction parameter for the dynamic response of the measurement channel (6) is determined on the basis of the detected dynamic response of the latter.

15 Claims, 1 Drawing Sheet

(51) Int. Cl.
*G01R 1/00* (2006.01)
*G01L 1/00* (2006.01)
*G06Q 10/00* (2012.01)

(56) References Cited

U.S. PATENT DOCUMENTS

| | | | |
|---|---|---|---|
| 5,519,300 A * | 5/1996 | Leon et al. | 318/729 |
| 6,591,200 B1 | 7/2003 | Cohen et al. | |
| 7,545,163 B2 * | 6/2009 | Disser | 324/765.01 |
| 7,577,482 B1 * | 8/2009 | Steele et al. | 700/19 |
| 2004/0095089 A1 | 5/2004 | Collier Hallman | |
| 2004/0100222 A1 * | 5/2004 | Karikomi | H02P 6/185 318/801 |

OTHER PUBLICATIONS

Finch et al., "Controlled AC Electrical Drives," IEEE Transactions on Industrial Electronics, IEEE Service Center, Piscataway, NJ, USA, col. 54, No. 2, Feb. 1, 2008, pp. 481-491.

* cited by examiner

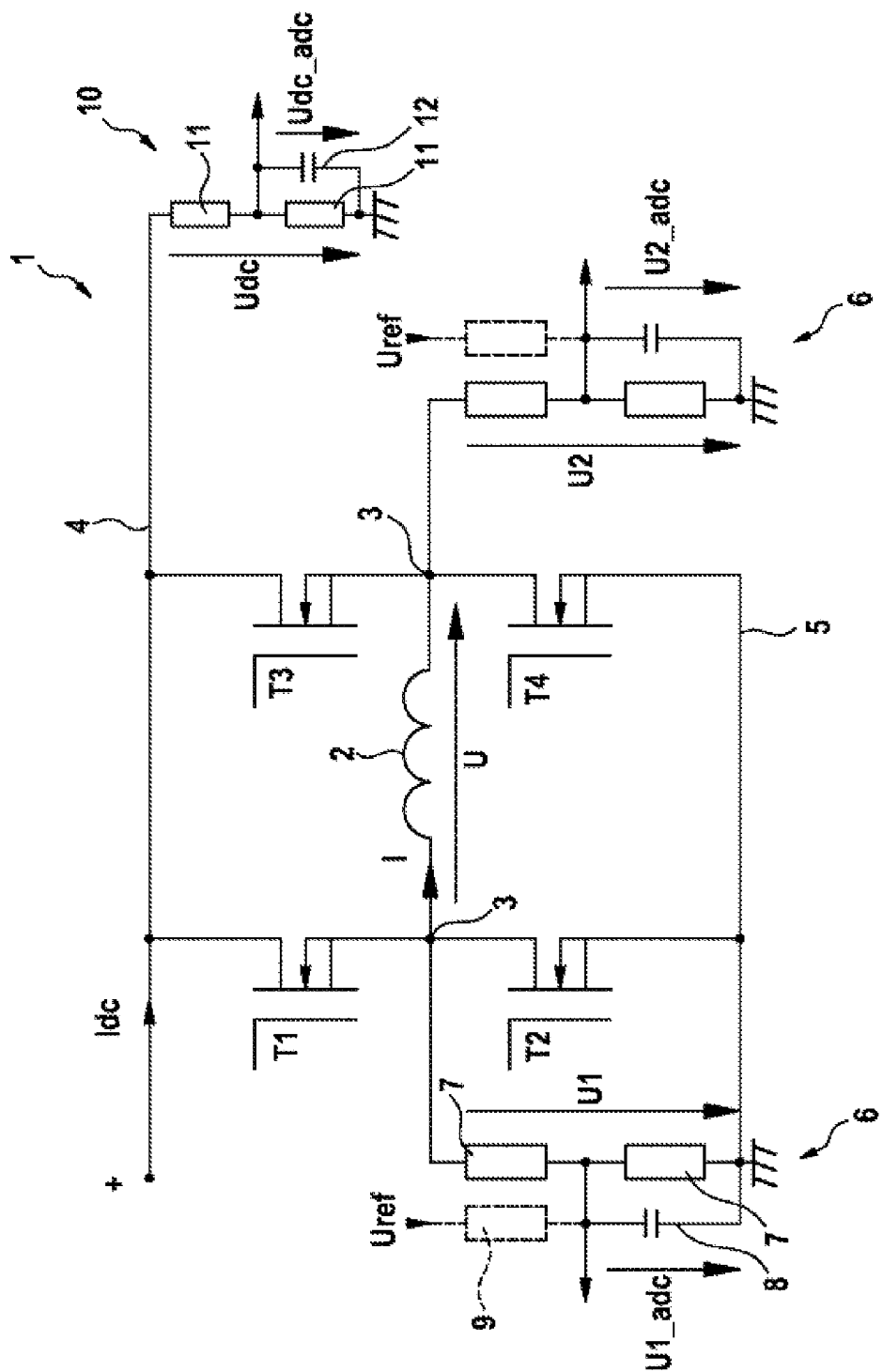

METHOD OR VOLTAGE DETECTION SYSTEM FOR DETERMINING A CORRECTION PARAMETER FOR A MEASUREMENT CHANNEL AND FOR DETECTING A TERMINAL VOLTAGE OF AN ELECTRIC MOTOR

BACKGROUND OF THE INVENTION

The present invention relates to a general method for measuring a terminal voltage across a connection terminal of an electric motor.

In the prior art terminal voltages, for example, of an electric motor are detected in order to be able to determine the rotation speed or else the exact position of the electric motor from said terminal voltages. By way of example, it is known in the case of DC motors or electrically commutated motors (EC motors) to detect the position and/or the rotation speed of the drive shaft of the electric motor without the use of a position sensor, which is fitted for example directly to the drive shaft, in a cost-effective manner. To this end, a voltage detection system is provided, said voltage detection system detecting one or more terminal voltages and transmitting said one or more terminal voltages to a control device in order to drive the electric motor. The voltage detection system can be designed as an integral constituent part of the control device of the electric motor or can be designed separately.

In order to be able to operate the electric motors at different rotation speeds, electrical or electronic switching elements, for example relays or transistors, are usually provided, it being possible for the respective connection terminal to be connected to at least one supply voltage or to earth by means of said electrical or electronic switching elements. Accordingly, a desired voltage can be applied and, furthermore, a desired operating mode can be set by deliberately switching over the switching elements on each winding of the electric motor for a desired time. Various types of circuit (H-bridge, 2H, 3H, B6 circuit) are customary for operating electric motors but these do not, in principle, make a distinction in terms of connecting and disconnecting a voltage to/from the connection terminal. However, on account of the inductance of the motor windings and possible voltage drops between the supply voltage or earth and the connection terminal, for example power losses, the voltage across the connection terminal does not correspond exactly to the applied voltage, and therefore explicit detection of the terminal voltage is required in order to be able to determine the position and the rotation speed of the drive shaft from said voltage.

In order to detect the terminal voltage, the voltage detection system comprises a measurement channel which is connected, at the input end, directly to the respective connection terminal in order to tap off the applied voltage and to output said applied voltage at its output. This can be done both by a purely analog connection and by the use of an analog/digital converter which outputs the detected terminal voltage as a digital signal. However, the tapped off terminal voltage is corrupted by the measurement channel, as a result of which it is made more difficult to exactly determine the position and the rotation speed of the drive shaft of the electric motor.

It is known in the art to detect the static response of the measurement channel in order to determine a correction parameter for the static response of the measurement channel, for example in relation to gain and/or a systematic measurement deviation. This correction parameter can be used in order to compensate the static response of the measurement channel. It is also known in the art to carry out automatic compensation of the static response of the measurement channel.

However, the measurement channel also comprises non-linear elements, as a result of which exact detection of the terminal voltage is made more difficult. This relates initially to parasitic capacitances or inductances of linear components, but capacitors and/or coils can also be used explicitly in the measurement channel. In order to keep these non-linear deviations low, high-quality components are used, as a result of which the detection of the terminal voltage is associated with high costs. Active components, for example operational amplifiers, are also sometimes used in order to be able to detect the terminal voltage with the desired degree of accuracy, this being associated with a great deal of effort and likewise high costs.

Proceeding from said prior art, the object of the present invention is to specify a method with which a correction parameter for compensating the non-linear properties of the measurement channel can be determined. A further object of the present invention is to specify a method for detecting the terminal voltage of a motor, which method detects the terminal voltage in a cost-effective manner and with a high degree of accuracy.

SUMMARY OF THE INVENTION

These objects are achieved by virtue of the method for determining a correction parameter for a measurement channel according to claim 1, by virtue of the method for detecting a terminal voltage, the computer program product, the apparatus for determining a correction parameter, the voltage detection system for detecting at least one terminal voltage according to the coordinate claims.

A first aspect provides a method for determining a correction parameter for a measurement channel which is connected to a connection terminal of an electric motor in order to measure a terminal voltage, wherein the connection terminal is connected to a first potential by means of switching elements for driving the electric motor, the connection terminal is connected to a second potential, which differs from the first, by switching over at least one switching element after a steady state of the measurement channel is reached, the dynamic response of the measurement channel is detected after connection to the second potential, and the correction parameter for the dynamic response of the measurement channel is determined on the basis of the detected dynamic response of said measurement channel.

The basic idea of the above method is therefore to use the existing switching elements to drive the motor, in order to apply a voltage jump to the measurement channel and to detect the reaction of the measurement channel as a step response. The type of change in voltage is unimportant in this case and can be a change from a high potential to a low potential or vice versa, wherein a potential can also be earth. The step response shows the dynamic response of the measurement channel and a correction parameter for the dynamic response of the measurement channel can be determined on the basis of said step response. The correction parameter can comprise an individual value and also a set of individual parameter values which, in its entirety, describes the dynamic response of the measurement channel. The detected measurement values of the terminal voltage can be compensated on the basis of the correction parameter in the measurement channel during operation, as a result of which the terminal voltage can be determined with a high degree of accuracy taking into consideration the dynamic response of the measurement channel.

In one refinement, detecting the dynamic response of the measurement channel comprises sampling a time profile of an output signal of the measurement channel. The discrete values detected in this way reflect, in their entirety, the profile of the voltage at the output of the measurement channel and can be easily electronically processed.

For example, the correction parameter can be determined as a filter parameter for filtering the output signal of the measurement channel. Depending on whether the output signal of the measurement channel is analog or digital, both an analog filter or else a digital filter can be used. The filter can be in the form of, for example, a low-pass filter in order to realize a corresponding low-pass response based on the filter parameter.

In a further refinement, digital filtering comprises IIR filtering (Infinite Impulse Response filtering). IIR filtering can be carried out in both an analog and digital manner.

In a further refinement of the invention, the first and/or second potential can be measured and the correction parameter for the dynamic response of the measurement channel can be determined with the inclusion of the measurement of the first and/or second potential in order to improve the accuracy of the detection of the correction parameter.

The dynamic response of the second potential can also be detected and the correction parameter of the dynamic response of the measurement channel can be determined with the inclusion of the dynamic response of the second potential. Fluctuations at the input of the measurement channel can therefore be detected and taken into account when determining the correction parameter.

For example, detecting the dynamic response of the second potential can comprise sampling a time profile of the second potential. The discrete values detected in this way reflect, in their entirety, the exact profile of the terminal voltage at the input of the measurement channel and can be easily electronically processed.

The dynamic response of one or more measurement channels can also be matched to the existing dynamics of an individual measurement channel which serves as a reference.

In a further refinement of the invention, detecting the dynamic response of the measurement channel can comprise dynamically detecting a current from the connection terminal into the electric motor and the correction parameter can be determined taking into account the dynamically detected current. Accordingly, voltages which are applied only in the measurement channel or currents flowing only in said measurement channel can be taken into consideration in order to be able to determine the correction parameter with a high degree of accuracy.

According to a further embodiment, the connection terminal can be electrically disconnected from the electric motor before it is connected to the second potential and can be electrically connected to the electric motor after the dynamic response of the measurement channel is detected. This prevents currents flowing from the connection terminal into the motor, said currents possibly occurring dynamically on account of the inductance and possibly further non-linear components of the electric motor.

Furthermore, at least one correction parameter for the static response, For example a gain and/or a systematic measurement deviation, of the measurement channel can be detected by
the connection terminal being connected to the first potential by means of the switching elements,
the static response of the measurement channel being detected after a steady state is reached,
the connection terminal being connected to the second potential by means of the switching elements,
the static response of the measurement channel being detected after a steady state is reached,
the at least one correction parameter for the static response of the measurement channel being determined on the basis of the detected static response of said measurement channel.

The combination of static and dynamic response provides a comprehensive description of the response of the measurement channel, and therefore the terminal voltage of the electric motor can be detected with a high degree of accuracy when the response of the measurement channel is compensated.

A further aspect provides an apparatus for determining a correction parameter for the dynamic response of a measurement channel which is connected to a connection terminal of an electric motor in order to measure a terminal voltage, having
a switching unit for operating switching elements for driving the electric motor,
a detection unit for detecting at least one voltage profile with respect to time, and
a control apparatus which drives the switching unit and is connected to the detection unit, in order to receive the at least one detected voltage profile from said detection unit, wherein the control apparatus is designed to detect the correction parameter in line with one of the above-mentioned methods.

In order to determine the correction parameter, said apparatus can be connected to connection terminals, measurement channels and switching elements in order to determine the correction parameter. It is also possible for the electric motor or a control device which is connected to it to have a single interface for connecting the apparatus according to the invention to the abovementioned connections, so that the apparatus can be connected to an individual plug. The control device comprises the voltage measurement device having the individual measurement channels or is connected to said voltage measurement device in order to receive the output signals from said voltage measurement device. If the interface is provided on the control device, the correction parameter, after the determination, can be stored in the voltage measurement device or transmitted to a separate compensation apparatus for compensating the respective measurement channel.

A further aspect provides a voltage detection system for detecting at least one terminal voltage of an electric motor. The voltage detection system comprises at least one measurement channel which, at the input end, is connected to a connection terminal of the electric motor and provides the detected terminal voltage at its output, wherein the voltage detection system comprises an above-described apparatus for determining a correction parameter for the dynamic response of at least one measurement channel, and a compensation apparatus is provided which is designed to compensate the dynamic response of the at least one measurement channel with the determined correction parameter. Therefore, the apparatus for determining the correction parameter is an integral constituent part of the voltage detection system, as a result of which the correction parameter can be determined at any time without additional components, for example by a command from the control device of the electric motor. Therefore, it is possible to compensate the dynamic response of the measurement channel, for example in the case of temperature fluctuations which result in a change in the component properties, or aging effects of individual components at any time again.

In a preferred embodiment of the invention, the control apparatus is a digital control apparatus, and the methods are implemented as computer program products, wherein the individual method steps are executed by the digital control apparatus.

Further advantageous refinements of the invention can be found in the dependent claims and in the description of an exemplary embodiment with reference to the appended drawing.

BRIEF DESCRIPTION OF THE DRAWINGS

Embodiments are explained in greater detail below in conjunction with the appended drawing, in which:

FIG. 1 shows a circuit diagram of a circuit arrangement having a motor, switching elements for driving the motor, and two measurement apparatuses for measuring a terminal voltage.

DETAILED DESCRIPTION

FIG. 1 shows a circuit arrangement 1 in which an electric motor 2 with two connection terminals 3 is arranged centrally. The current through the electric motor 2 is denoted I and the voltage dropped across said electric motor is denoted U. In this embodiment, the electric motor 2 is designed as a DC motor and is connected in an H-bridge circuit with a supply line 4 and an earth line 5. In this case, a first switching element in the form of a transistor T1, T3 is provided between each connection terminal 3 and the supply line 4, and a second switching element in the form of a transistor T2, T4 is provided between each connection terminal 3 and the earth line 5. The transistors T1, T2, T3, T4 are operated between the operating states "on" and "off" in the form of switches, wherein a control device (not shown) switches the transistors during operation.

Each connection terminal 3 is connected to a measurement channel 6. The measurement channel 6 which is connected to the connection terminal 3 which is on the left-hand side in the FIGURE is connected, at the input end, to a potential U1 which corresponds to a terminal voltage across the left-hand-side connection terminal 3, and supplies a voltage U1_adc at the output end. The measurement channel 6 which is connected to the connection terminal 3 which is on the left-hand side in the FIGURE is connected, at the input end, to a potential U2 which corresponds to a terminal voltage across the left-hand-side connection terminal 3, and provides a voltage U2_adc at the output end.

The measurement channels 6 are, in principle, of identical design and in this case represented, by way of example, by two resistors 7 and a capacitor 8. However, the design of the measurement channels 6 is not relevant any further; it is only necessary to show that non-linear components are also present in the measurement channel 6, either by way of the capacitor 8 which is explicitly illustrated here or by way of parasitic capacitances and/or inductances. The measurement channel 6 can also contain active components, as indicated by a resistor 9 which is shown in dashed lines and is connected to a reference voltage Uref. Therefore, operational amplifiers, for example, can also be present in each measurement channel 6. It is not necessary for both measurement channels 6 to be of identical design either.

A supply voltage Udc is applied to the supply line 4, said supply voltage being a stabilized intermediate circuit voltage. The intermediate circuit voltage Udc allows a reduced reactive effect on an input supply system. A measurement circuit 10, which is represented by two resistors 11 and a capacitor 12 here by way of example, is connected to the supply line 4. Said measurement circuit provides a voltage Udc_adc at the output end, said voltage being a measure of the intermediate circuit voltage Udc.

The method for determining a correction parameter for compensating the response of the measurement channel 6 will now be described in the text which follows. Insofar as the method is applied in an identical manner to both measurement channels 6, the method is explicitly specified only for the measurement channel 6 which is on the left-hand side in the FIGURE and the same applies for the other measurement channel 6. Therefore, in the text which follows, all the information provided, unless stated otherwise, relates to the elements which are shown on the left-hand side of the electric motor 2 in the FIGURE. The method is carried out by a control apparatus (not shown) by processing software.

In this exemplary embodiment, a correction parameter for the static response of the measurement channel 6 is detected first. To this end, the intermediate circuit voltage Udc at the output of the measurement circuit 10 is first detected by means of a detection unit (not shown) which is connected to the control apparatus. A switching unit (not shown here) which is actuated by the control apparatus then switches on the first switching element, the transistor T1, and switches off the second switching element, the transistor T2. After a steady state has been established, the supply voltage Udc is applied to the input end of the measurement channel 6, that is to say the terminal voltage U1 is equal to Udc. In this state, the voltage U1_adc is detected by the detection unit at the output of the measurement channel 6. The switching unit then turns off the transistor T1 and turns on the transistor T2. After a steady state has been established, the measurement channel 6 is connected to earth at the input end, that is to say the terminal voltage U1 is equal to 0. The same applies for the terminal voltage U1 of the relationship shown in Equation 1.1.

$$U1 = \frac{U1\_adc - U1\_adc(U1 = 0)}{U1\_adc(U1 = Udc) - U1\_adc(U1 = 0)} \cdot Udc(U1 = Udc) \qquad 1.1$$

Proceeding from the above, a correction parameter for the static response of the measurement channel 6 is determined in the control apparatus. The correction parameter comprises two individual parameter values, a gain and a systematic measurement deviation (bias), with the result being the relationship represented in Equation 1.2.

$$U1 = U1\_adc \cdot \text{gain} + \text{bias} \qquad 1.2$$

Rewriting the equations gives Equation 1.3 for the gain and Equation 1.4 for the systematic measurement deviation.

$$\text{Gain} = \frac{Udc(U1 = Udc)}{U1\_adc(U1 = Udc) - U1\_adc(U1 = 0)} \qquad 1.3$$

$$\text{Bias} = -U1\_adc(U1 = 0) \cdot \text{Gain} \qquad 1.4$$

This correction parameter is detected in an identical manner for the measurement channel 6 on the right-hand side in the FIGURE. In addition, the detected values for the gain and the systematic measurement deviation between the two measurement channels 6 are compensated in the control apparatus. Accordingly, the same values are output by both measurement channels 6 when the intermediate circuit voltage Udc or earth is applied to the respective connection terminal 3. This is achieved, for example, by taking an average of the two measurement channels 6.

The method for determining a correction parameter for the dynamic response of the measurement channel 6 is described below. To this end, the control apparatus first turns off the transistor T1 and turns on the transistor T2 by means of the switching unit, so that the connection terminal 3 is connected to the earth line 5 and is at earth potential. After a steady state has been established, the transistor T1 is turned on by the switching unit and the transistor T2 is turned off, so that the connection terminal 3 is connected to the supply line 4.

After the switchover, the dynamic response of the measurement channel 6 is detected by the output voltage U1_*adc* being sampled by the detection unit. In addition, the dynamic response of the intermediate circuit voltage Udc is also detected by the detection unit by sampling. The intermediate circuit voltage Udc is applied to the connection terminal 3 after the switchover and is therefore equal to the terminal voltage U1. The sampling values are transmitted by the detection unit to the control apparatus.

A correction parameter for the dynamic response of the measurement channel 6 is then determined by the control apparatus. This is shown here, by way of example, for a low-pass filter of the first order. The filter which is respectively to be used is dependent on the measurement channel 6. The low-pass filter used is an IIR filter (Infinite Impulse Response filter) which is represented in general form in accordance with Equation 1.5.

$$y_k = \lambda \cdot u_k + (1-\lambda) y_{k-1} \qquad 1.5$$

where:
$y_k$: output signal series (U1_*adc*)
$x_k$: input signal series (Udc)
$\lambda$: time constant coefficient The time constant coefficient can be specified in accordance with Equation 1.6

$$\lambda = 1 - \exp\left(-\frac{Ts}{\tau}\right) \qquad 1.6$$

where Ts is the sampling time and $\tau$ is the time constant. Solving for the time constant coefficient $\lambda$ gives the relationship from Equation 1.7.

$$\lambda_k = \frac{U1_k - U1_{k-1}}{Udc_{k-1} - U1_{k-1}} \qquad 1.7$$

Assuming that $\lambda_k$ is constant, the time constant coefficient $\lambda$ can be determined by taking the average of a plurality of sampling time points, as is shown in Equation 1.8.

$$\lambda = \frac{1}{N} \cdot \sum_{1}^{N} \lambda_k \qquad 1.8$$

The time constant coefficient $\lambda$ therefore describes the dynamic response of the measurement channel 6 and can be used as a correction parameter. To this end, the circuit arrangement 1 is supplemented with an IIR filter (not shown here) for the respective measurement channel 6. Accordingly, an adapted signal U1' with a desired dynamic $\lambda$', as specified in Equation 1.9, can be formed.

$$U1'_k = \alpha \cdot U1_k + (\lambda' - \alpha) \cdot U1_{k-1} + (\lambda' - 1) \cdot U1'_{k-1} \qquad 1.9$$

where $\alpha = \lambda'/\lambda$.

Therefore, the non-linear response of the measurement channel 6 can additionally be compensated with the aid of the IIR filter, as a result of which the terminal voltage U1 can be determined with a high degree of accuracy. The non-linear response is independent for each measurement channel 6, and therefore no further compensation between the two measurement channels 6 is required here.

In the embodiment shown, the switching unit, the detection unit and the control apparatus are combined in an apparatus for determining a correction parameter for the dynamic response of a measurement channel.

A voltage detection system for detecting at least one terminal voltage U1, U2 of the electric motor 2 comprises the apparatus for determining a correction parameter for the dynamic response of the measurement channels 6, the measurement channels 6 and also the IIR filter which is associated with each measurement channel 6. The respective time constant coefficient $\lambda$ is automatically transmitted by the control apparatus. The voltage detection system is connected to the control device and provides said control device with the detected values of the terminal voltages U1, U2 during operation.

The invention claimed is:

1. A method for determining a correction parameter for a measurement channel which is connected to a connection terminal of an electric motor in order to measure a terminal voltage, the method comprising:
    connecting the connection terminal to a first potential by means of switching elements for driving the electric motor,
    connecting the connection terminal to a second potential, which differs from the first, by switching over at least one switching element after a steady state of the measurement channel is reached,
    detecting the dynamic response of the measurement channel after connection to the second potential, and
    determining the correction parameter for the dynamic response of the measurement channel on the basis of the detected dynamic response of said measurement channel.

2. The method according to claim 1, wherein detecting the dynamic response of the measurement channel comprises sampling a time profile of an output signal of the measurement channel.

3. The method according to claim 1, wherein the measurement channel has an output and the correction parameter is determined as a filter parameter for digitally filtering the output signal of the measurement channel.

4. The method according to claim 3, wherein digital filtering comprises IIR filtering (Infinite Impulse Response filtering).

5. The method according to claim 1, wherein the first and/or second potential are/is measured and the correction parameter for the dynamic response of the measurement channel is determined with the inclusion of the measurement of the first and/or second potential.

6. The method according to claim 1, wherein the dynamic response of the second potential is detected and the correction parameter for the dynamic response of the measurement channel is determined with the inclusion of the dynamic response of the second potential.

7. The method according to claim 6, wherein detecting the dynamic response of the second potential comprises sampling a time profile of the second potential.

8. The method according to claim 1, wherein the dynamic response of a further measurement channel, which serves as a reference, is detected and the correction parameter for the dynamic response of the measurement channel is determined with the inclusion of the dynamic response of the reference measurement channel in order to adjust the dynamic response.

9. The method according to claim 8, wherein detecting the dynamic response of the further measurement channel, which serves as a reference, comprises sampling a time profile of the reference measurement channel.

10. The method according to claim 1, wherein detecting the dynamic response of the measurement channel comprises dynamically detecting a current from the connection terminal into the electric motor and the correction parameter is determined taking into account the dynamically detected current.

11. The method according to claim 1, wherein the connection terminal is electrically disconnected from the electric motor before it is connected to the second potential and is electrically connected to the electric motor after the dynamic response of the measurement channel is detected.

12. A method for detecting a terminal voltage of an electric motor, wherein the terminal voltage is tapped off at a connection terminal of the electric motor and is provided at the output of a measurement channel, wherein a correction parameter for the measurement channel is determined in line with the method according to claim 1, and the dynamic response of the measurement channel is compensated by the determined correction parameter.

13. An apparatus for determining a correction parameter for the dynamic response of a measurement channel which is connected to a connection terminal of an electric motor in order to measure a terminal voltage, having a switching unit for operating switching elements for driving the electric motor,
a detection unit for detecting at least one voltage profile with respect to time, and
a control apparatus which drives the switching unit and is connected to the detection unit, in order to receive the at least one detected voltage profile from said detection unit, wherein the control apparatus is designed to detect the correction parameter in line with the method of claim 1.

14. A voltage detection system for detecting at least one terminal voltage of an electric motor, having at least one measurement channel which, at the input end, is connected to a connection terminal of the electric motor and provides the detected terminal voltage at its output, wherein the voltage detection system comprises an apparatus for determining a correction parameter for the dynamic response of at least one measurement channel according to claim 12, and a compensation apparatus is provided which is designed to compensate the dynamic response of the at least one measurement channel with the determined correction parameter.

15. A method of determining at least one correction parameter for a static response of a measurement channel, the method comprising:
connecting a connection terminal to a first potential by switching elements,
detecting the static response of the measurement channel after a steady state is reached after connecting the connection terminal to the first potential by the switching elements,
connecting the connection terminal to a second potential by the switching elements,
detecting the static response of the measurement channel after a steady state is reached after connecting the connection terminal to the second potential by the switching elements,
determining the at least one correction parameter for the static response of the measurement channel on the basis of the detected static response of said measurement channel.

* * * * *